(12) United States Patent
Wirtz et al.

(10) Patent No.: US 8,228,065 B2
(45) Date of Patent: Jul. 24, 2012

(54) TRANSMISSION LINE FOR USE IN MAGNETIC RESONANCE SYSTEM

(75) Inventors: Daniel Wirtz, Hamburg (DE); Oliver Lips, Hamburg (DE); Sascha Krueger, Hamburg (DE); Bernd David, Huettblek (DE); Steffen Weiss, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 404 days.

(21) Appl. No.: 12/520,182

(22) PCT Filed: Dec. 20, 2007

(86) PCT No.: PCT/IB2007/055252
§ 371 (c)(1),
(2), (4) Date: Jun. 19, 2009

(87) PCT Pub. No.: WO2008/078294
PCT Pub. Date: Jul. 3, 2008

(65) Prior Publication Data
US 2010/0013484 A1     Jan. 21, 2010

(30) Foreign Application Priority Data

Dec. 22, 2006 (EP) .................................... 06126958

(51) Int. Cl.
*G01V 3/00* (2006.01)
*A61B 5/05* (2006.01)

(52) U.S. Cl. ........ 324/322; 324/318; 324/307; 324/309; 600/413; 600/422; 600/433

(58) Field of Classification Search .......... 324/300–322; 382/128–131; 600/407–435; 623/1.42; 340/10.1, 340/10.34
See application file for complete search history.

(56) References Cited

U.S. PATENT DOCUMENTS

| | | | | |
|---|---|---|---|---|
| 2,916,690 A * | 12/1959 | Leete | ............................ | 324/322 |
| 3,250,986 A * | 5/1966 | McKay | ......................... | 324/303 |
| 3,437,914 A * | 4/1969 | Lantz et al. | .................... | 324/303 |
| 5,812,065 A * | 9/1998 | Schrott et al. | ............. | 340/10.34 |
| 6,171,240 B1 * | 1/2001 | Young et al. | .................. | 600/410 |
| 6,535,108 B1 * | 3/2003 | Schrott et al. | ................ | 340/10.1 |

(Continued)

FOREIGN PATENT DOCUMENTS

GB            1185392            3/1970

(Continued)

OTHER PUBLICATIONS

Greatbatch, W., et al.; Magnetic Resonance Safety Testing of a Newly-Developed Fiber-Optic Cardiac Pacing Lead; 2002; J. MRI; 16:97-103.

(Continued)

*Primary Examiner* — Melissa Koval
*Assistant Examiner* — Tiffany Fetzner

(57) ABSTRACT

An electrically conductive transmission cable for supplying a DC signal safely to an electrical device in the presence of radio-frequency (RF) fields in a magnetic resonance (MR) is disclosed herein. The transmission cable comprises a transmission line (STL) comprising at least a first segment (S1) and a second segment (S2), wherein the first and second segments are electrically connected to each other by a reactive coupling unit (103), and a rectifier unit (101) connected to the transmission line and configured to extract the DC signal (203) from the modulated DC signal (201). The extracted DC signal may be supplied to an electrical device or used for cardiac pacing. The transmission cable finds application in auxiliary devices used in an MR environment, for example an interventional catheter with or without an active tracking circuit (301).

18 Claims, 4 Drawing Sheets

U.S. PATENT DOCUMENTS

| | | | |
|---|---|---|---|
| 6,585,763 B1 * | 7/2003 | Keilman et al. | 623/1.42 |
| 7,123,129 B1 * | 10/2006 | Schrott et al. | 340/10.1 |
| 7,205,768 B2 * | 4/2007 | Schulz et al. | 324/322 |
| 7,391,213 B2 * | 6/2008 | Watkins et al. | 324/318 |
| 7,777,492 B2 * | 8/2010 | Vernickel et al. | 324/322 |
| 2004/0124838 A1 | 7/2004 | Duerk et al. | |
| 2005/0245814 A1 | 11/2005 | Anderson et al. | |
| 2010/0013484 A1 * | 1/2010 | Wirtz et al. | 324/318 |

FOREIGN PATENT DOCUMENTS

| | | |
|---|---|---|
| WO | 2004090914 A1 | 10/2004 |
| WO | 2005103748 A1 | 11/2005 |
| WO | 2005116676 A1 | 12/2005 |
| WO | 2006003566 A1 | 1/2006 |
| WO | 2006067703 A2 | 6/2006 |
| WO | 2006103635 A1 | 10/2006 |

OTHER PUBLICATIONS

Lips, O., et al.; Concept for RF-safe electrophysiology pacing catheters using a transformer-based transmission line; 2007; Proc. Intl. Soc. Mag. Reson. Med.; 15:237.

Weiss, S., et al.; Transmission Line for Improved RF Safety of Interventional Devices; 2005; MRM; 54:182-189.

* cited by examiner

TRANSMISSION LINE FOR USE IN MAGNETIC RESONANCE SYSTEM

FIELD OF THE INVENTION

The invention relates to the field of magnetic resonance (MR), particularly to transmission of electrical currents in the presence of radio-frequency (RF) fields.

BACKGROUND OF THE INVENTION

U.S. Pat. No. 7,750,637 discusses a transmission line that is especially provided for connecting an electrical device, like for example an accessory device of an MR imaging system, to a connection unit, like for example a power supply or a control unit. The transmission line is also suitable for connecting implants especially with long conductors or electrodes, like for example heart pacemakers or artificial nerves, for supplying power to preamplifiers, for MR compatible IVUS (intravascular ultrasound) devices, for tracking of catheters or guide wires during MR image generation, and other applications which require a transmission line which is safe when guided through an RF field (for example generated by an MR imaging system). The transmission line comprises at least one transformer for coupling at least two lead segments of the transmission line and for providing safety of the line when guided through an RF field, wherein the lead segments and/or the transformer are provided in the form of at least one metallic structure on a substrate. The transmission line finds use in electrophysiology catheters used in cardiac interventional procedures performed under MR guidance.

SUMMARY OF THE INVENTION

During cardiac interventions, a catheter typically has to provide three basic functionalities requiring signal transmission: mapping of the intracardiac electrocardiogram (ECG) signals, transmitting DC pacing signals for cardiac pacing and supplying DC power for RF ablation of tissue. Using MR as an imaging modality for guiding catheter interventions imposes restrictions on the equipment used, since conducting structures, like a long metallic wire or cable, inside an MR-system are susceptible to RF-heating, especially at the tip of the conducting structures. For the transmission of high frequency signals as for active catheter tracking, tip heating can be vastly suppressed by using a transformer-based transmission line, as explained in the U.S. Pat. No. 7,750,637 cited above. Mapping of the low frequency intracardiac ECG signals can be made MR-safe using highly resistive wires. However, providing safe DC-power transmission in the presence of RF fields, as required for example for cardiac pacing or for RF ablation, is more difficult. Thus standard electrophysiology catheters, which employ conducting wires for signal transmission, are not usable in an MR environment.

It is thus desirable to have a transmission cable that is capable of transmitting DC signals safely to the tip of an auxiliary device, for example an interventional catheter, in the presence of RF fields.

Accordingly, an electrically conductive transmission cable for transmitting a DC signal in the presence of RF fields is disclosed herein. The transmission cable comprises a transmission line including at least a first segment and a second segment, wherein the first and second segments are electrically connected to each other by a reactive coupling unit. The term "reactively coupled" or "reactive coupling" indicates inductive coupling, capacitive coupling or a combination of the two. The reactive coupling unit, therefore, is a unit that is capable of establishing such a reactive coupling or connection between the first and second segments. The reactive coupling unit could be a transformer or an impedance unit such as a capacitor or an inductor. The transmission line may typically be a coaxial cable, though pair lines are also possible. Such a transmission cable is henceforth also referred to as a safe transmission line (STL). The transmission cable is configured to receive a modulated DC signal as an input. A rectifier unit, connected to the transmission line, is configured to extract the DC signal from the modulated DC signal. The extracted DC signal may be supplied to an electrical device or to cardiac tissue for pacing the heart.

BRIEF DESCRIPTION OF THE DRAWINGS

These and other aspects will be described in detail hereinafter, by way of example, on the basis of the following embodiments, with reference to the accompanying drawings, wherein:

FIG. 2(*b*) shows a rectified and filtered DC signal obtained from the amplitude-modulated DC signal;

Corresponding reference numerals when used in the various figures represent corresponding elements in the figures.

DETAILED DESCRIPTION OF EMBODIMENTS

Figure 1:
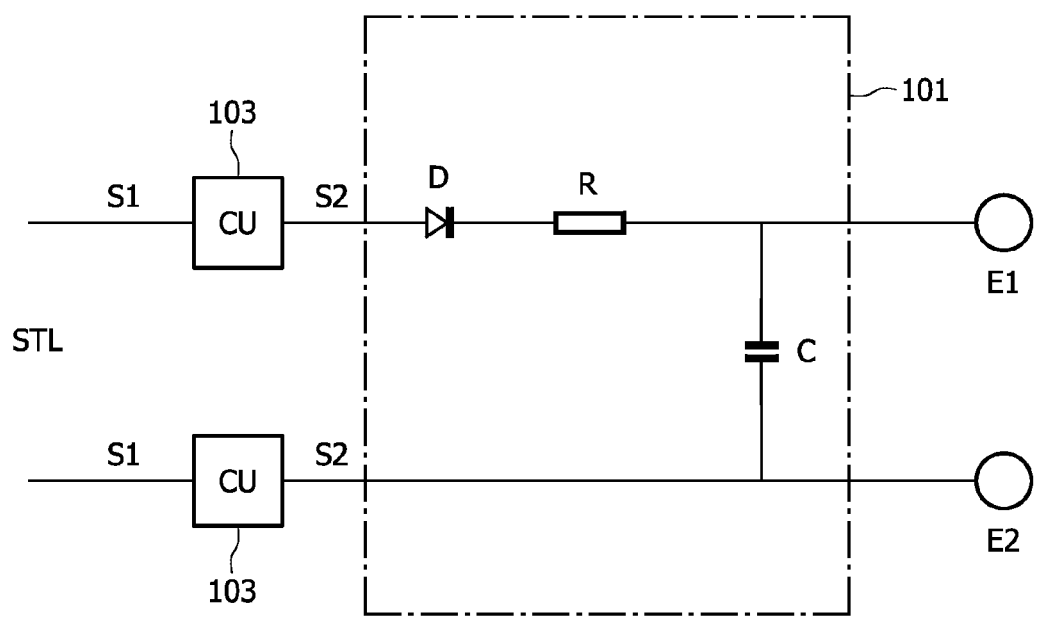
FIG. 1 shows one possible embodiment of the transmission cable as disclosed herein.

FIG. 1 shows a possible embodiment of the transmission cable as disclosed herein, used for transmitting DC-power needed for cardiac pacing to the electrodes E1, E2 of a catheter (or other auxiliary interventional device) in an MR-safe manner. A rectifier unit 101 located at the end of the transmission cable proximal to the electrodes E1, E2 rectifies an amplitude-modulated DC signal (201 in FIG. 2*a*) and extracts a DC signal (203 in FIG. 2*b*). The transmission cable comprises a first segment S1 and a second segment S2 electrically connected to each other by coupling units (CU) 103. For the purpose of cardiac pacing, the DC signals or pulses typically last several milliseconds and lead to a direct current of a few milliamperes (mA) between the electrodes E1, E2 at the tip of the transmission cable. For other applications, it is possible to generate pulses lasting either for longer or shorter durations. The currents generated at the tip will depend on the resistance between the electrodes E1, E2. The rectifier unit 101 may be implemented as a diode (D) connected in series to a low-pass filter (LPF) circuit consisting of a resistor R and a capacitor C. In some embodiments, it may not be necessary to add the resistance as a separate unit, as the resistance of the diode and the transmission line may provide sufficient resistance to achieve the required low-pass filtering effect. Other implementations of the rectifier unit are also possible and will work with the transmission cable disclosed herein.

Figure 2A:
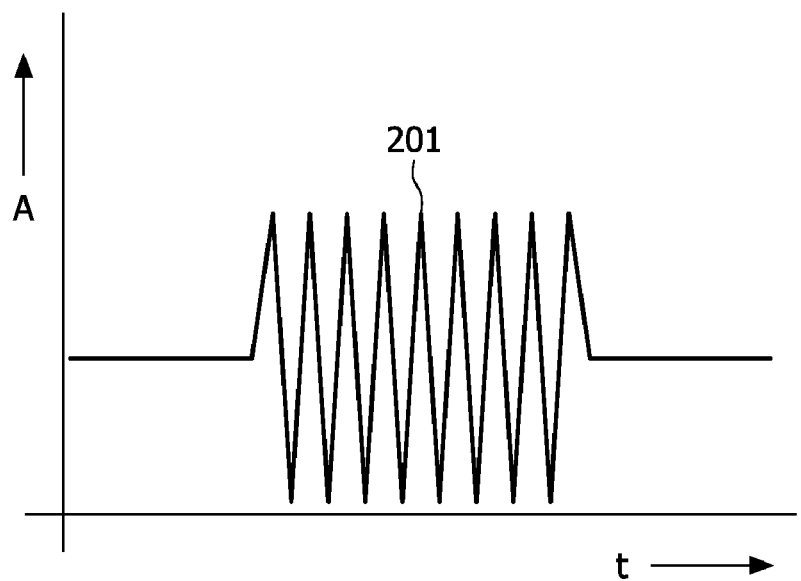
FIG. 2(*a*) shows an example of an amplitude-modulated DC signal that may be transmitted over a transmission cable as disclosed herein.
Figure 2B:
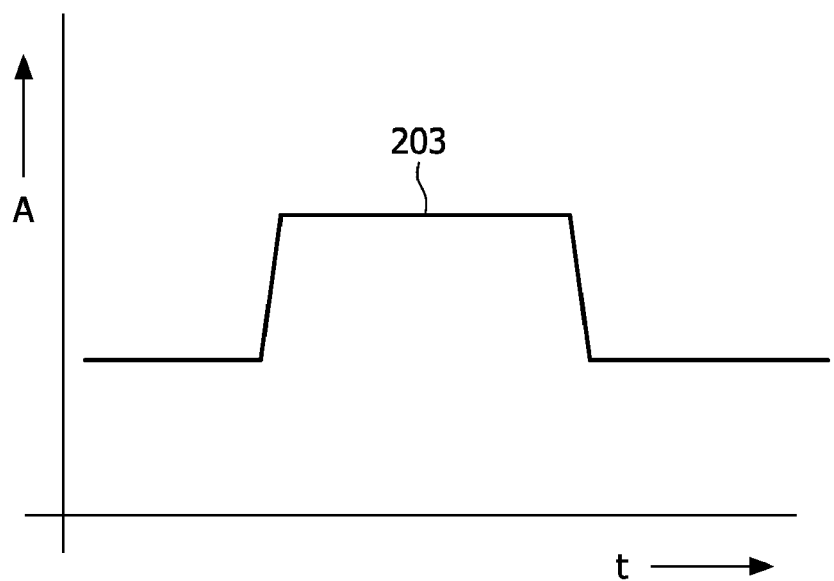

FIG. 2*b* shows the desired DC-current waveform 203 that is to be supplied to the electrodes E1, E2. The desired DC-current waveform 203 is modulated upon an RF carrier, as shown in FIG. 2*a*, which allows the propagation of the DC-current waveform across the transmission cable. The center frequency of the RF carrier wave is located away from the MR resonance frequency of the nuclear species under investigation, for example 64 MHz for $^1$H (proton) at 1.5T, 34 MHz for $^{23}$Na (sodium) at 3T or 200 MHz for $^1$H at 4.7T, etc., in order to prevent interference with the MR signal. In both FIGS. 2a and 2b, the horizontal axis marked "t" is the time axis while the vertical axis marked "A" shows the amplitude or intensity of the signal.

The amplitude-modulated DC signal 201 can pass through the transmission cable up to the diode D, where it is rectified and passed to the LPF. The LPF circuit defines the highest frequency component that is transmitted further to the electrodes E1 and E2. Exemplary values for the LPF circuit are 10Ω for the resistor R and 10 nF for the capacitance C, including a 0.5Ω of serial loss. A conventional silicon diode may be used for the diode D. In this way it is possible to transmit a DC-pulse carrying the power for cardiac pacing or other purposes to the electrodes E1, E2 in a manner that is MR-compatible.

The coupling units 103 are "reactive" coupling units in the sense that they provide an inductive and/or a capacitive method of coupling the first segment S1 and the second segment S2. It may be noted that the transmission cable disclosed herein can comprise many such segments, with one or more reactive coupling units 103 being used to couple each pair of segments. The reactive coupling units may be transformer-based or impedance-based.

In the impedance-based type of reactive coupling unit, the first segment S1 and the second segment S2 are electrically connected to each other by means of an inductor or a capacitor, while in the transformer-based type of reactive coupling unit, the segments are connected by means of a transformer. In both cases, either the coupling unit (i.e., the transformer or the impedance) and/or the transmission line are provided in the form of at least one metallic structure on a substrate. The substrate could be a single- or multi-layer laminate of metal and dielectric materials and the segments could be provided in the form of striplines on and/or within the substrate. The segments could comprise parallel striplines which could be shielded by twisting the transmission line so that induction of high net-voltages is at least substantially avoided. The shielding could be achieved by localized swaps of the segments. The transformer may be realized in the form of at least one inductively coupling element, for example by inductively coupling electrically conductive loops on different metal layers of the substrate. A matching network, for matching a segment to a transformer, could include at least an inductor and/or a capacitor and/or a resistor. The capacitor, inductor and/or resistor elements could be embedded into the layer structure of the substrate. Further details regarding a transformer-based STL may be found in U.S. Pat. No. 7,750,637 cited above and regarding an impedance-based STL may be found in US Patent Publication No. 2006/0258936.

For efficient rectification of the amplitude-modulated DC current, diodes with fast recovery times, e.g., Schottky diodes of the type BAS40 (Infinion, 40V, 120 mA, 100 ps charge carrier lifetime) may be employed. A surface mount device (SMD) capacitor of 1 nF (not shown) may be connected across the terminals E1, E2, to smooth the DC current being supplied to a cardiac pacing device or other DC-powered devices. The cardiac pacing device may either be the terminals E1, E2 or could be another set of electrodes that connect to terminals E1, E2, and in turn supply the pacing pulses to the heart.

Figure 3:
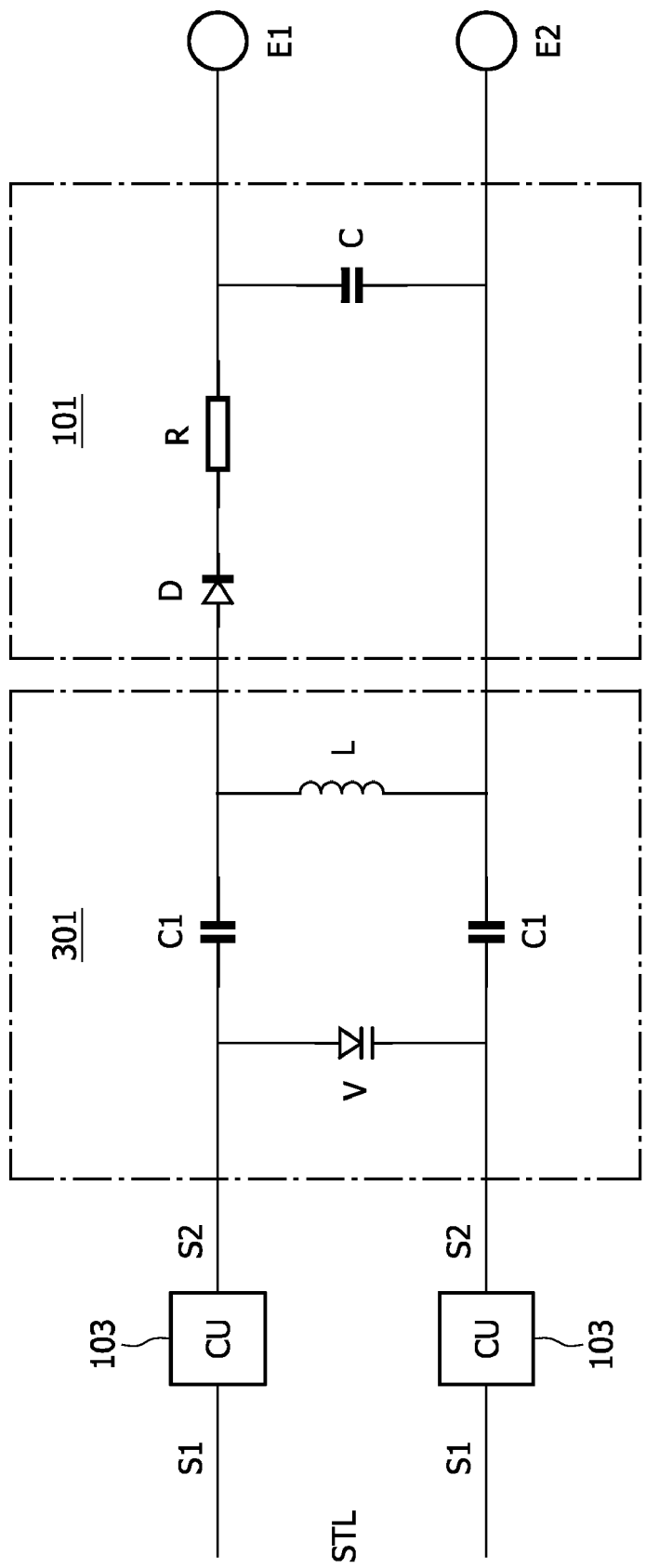
FIG. 3 shows the transmission cable as disclosed herein in conjunction with an active tracking circuit for use in an interventional catheter.

The proposed concept can also be applied to active tracking catheters as shown in FIG. 3. Before the rectification and filtering circuitry in the rectifier unit 101, a tuneable resonance circuit consisting of a varactor V, capacitances C1 and a tracking coil L is inserted. The tracking coil L may also be used for localized MR imaging. Thus, in this setup, the varactor V allows tuning of the tracking coil L to resonance when imaging or catheter tracking is being performed. The voltage needed for operating the varactor can be applied using highly resistive wires, which assures its RF-safety, i.e., safety in the presence of RF fields. The capacitances C1 avoid short-cut of the DC current that controls the varactor. The varactor can be tuned such that pulses which could potentially pace the heart generated by induced RF in the transmission line are reflected.

The varactor is in principle a capacitance that can be tuned with an external voltage. In order to provide the tracking functionality, there must be a resonant circuit in the device that generates the tracking signal. This is given by the combination of the capacitors C1, V and the inductivity L. The varactor V can be used to tune/detune this resonator. Using highly resistive wires, a voltage of a few volts may be applied for tuning in an RF-safe way. This voltage can drive a DC-current in the forward direction (to the electrodes) which is then blocked by C1. If the resonance circuit formed by V, C1 and L is then tuned to a particular MR-resonance frequency for tracking, for example the $^1$H resonance frequency, the RF-pulses generated for imaging could induce signals in the transmission cable. These signals could possibly be a danger since unwanted pacing of the patient's heart might occur due to these signals. By preparing the circuit in such a way that V has a high value, the signals (induced in the transmission cable by the RF imaging pulses) are short-circuited across V and thus pose no danger with regards to unwanted pacing.

Delivering the DC currents and voltages needed for cardiac pacing or other purposes to the tip electrodes of an interventional device using a transmission cable as disclosed herein effectively suppresses common mode resonances. As it is the common mode resonances that interact with the RF fields to generate heat at the tips of conducting lines, using an STL thus effectively reduces heating due to the transmission line. Differential mode signal, on the other hand, can be transmitted within a frequency range of some ten MHz around the resonance frequency, for example 64 or 128 MHz for $^1$H at 1.5 and 3T, respectively. In this way, modulation frequencies sufficiently removed from the MR resonance frequency can be chosen in order not to disturb the tracking (MR)-signal.

It may be noted that the transformers present in the STL might introduce some additional losses to the signal used for active tracking.

In addition to the capability to transfer modulated DC signals, due to the wide transmission bandwidth of the transmission line as disclosed herein, it might also be possible to provide MR-compatible transmission of non-MR signals at various frequencies.

The proposed concept can also be applied to active tracking catheters as shown in FIG. 3. Before the rectification and filtering circuitry in the rectifier unit 101, a tuneable resonance circuit includes a varactor V, capacitances C1 and a tracking coil L is inserted. The tracking coil L may also be used for localized MR imaging. Thus, in this setup, the varactor V allows tuning of the tracking coil L to resonance when imaging or catheter tracking is being performed. The voltage needed for operating the varactor can be applied using highly resistive wires, which assures its RF-safety, i.e., safety in the presence of RF fields. The capacitances C1 avoid short-cut of the DC current that controls the varactor. The varactor can be tuned such that pulses which could potentially pace the heart generated by induced RF in the transmission line are reflected.

Figure 4:
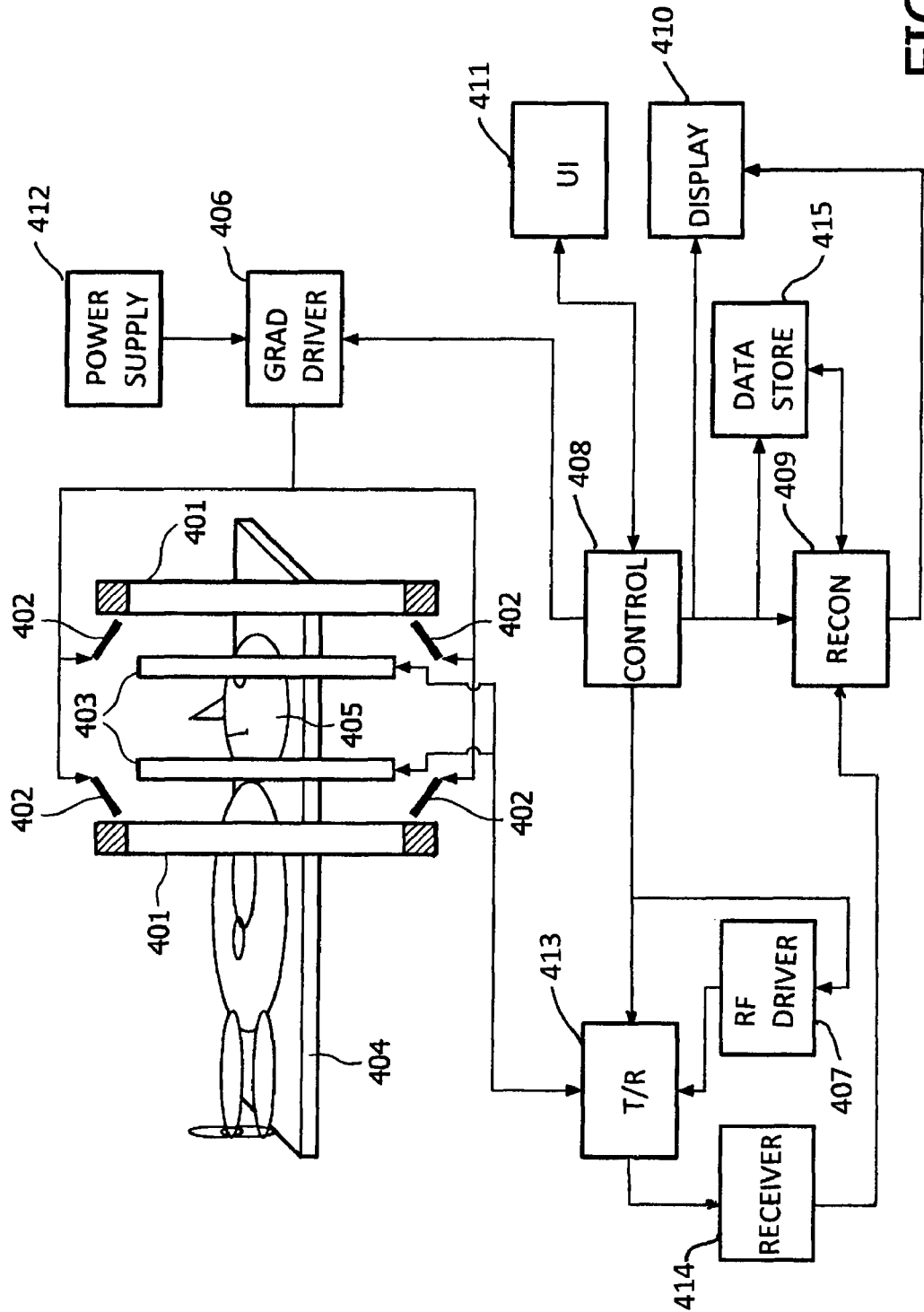
FIG. 4 shows an MR system in which the transmission cable disclosed herein may be used to safely transfer DC signal.

FIG. 4 shows a possible embodiment of an MR system capable of employing a transmission cable as disclosed herein, especially in interventional procedures conducted in or near the MR system. The MR system comprises a set of main coils 401, multiple gradient coils 402 connected to a gradient driver unit 406, and RF coils 403 connected to an RF coil driver unit 407. The function of the RF coils 403, which may be integrated into the magnet in the form of a body coil, or may be separate surface coils, is further controlled by a transmit/receive (T/R) switch 413. The multiple gradient coils 402 and the RF coils are powered by a power supply unit 412. A transport system 404, for example a patient table, is used to position a subject 405, for example a patient, within the MR imaging system. A control unit 408 controls the RF coils 403 and the gradient coils 402. The control unit 408, though shown as a single unit, may be implemented as multiple units as well. The control unit 408 further controls the operation of a reconstruction unit 409. The control unit 408 also controls a display unit 410, for example a monitor screen or a projector, a data storage unit 415, and a user input interface unit 411, for example, a keyboard, a mouse, a trackball, etc.

The main coils 401 generate a steady and uniform static magnetic field, for example, of field strength 1T, 1.5T or 3T. The disclosed RF coil array with charging circuit may be employed at other field strengths as well. The main coils 401 are arranged in such a way that they typically enclose a tunnel-shaped examination space, into which the subject 405 may be introduced. Another common configuration comprises opposing pole faces with an air gap in between them into which the subject 405 may be introduced by using the transport system 404. To enable MR imaging, temporally variable magnetic field gradients superimposed on the static magnetic field are generated by the multiple gradient coils 402 in response to currents supplied by the gradient driver unit 406. The power supply unit 412, fitted with electronic gradient amplification circuits, supplies currents to the multiple gradient coils 402, as a result of which gradient pulses (also called gradient pulse waveforms) are generated. The control unit 408 controls the characteristics of the currents, notably their strengths, durations and directions, flowing through the gradient coils to create the appropriate gradient waveforms. The RF coils 403 generate RF excitation pulses in the subject 405 and receive MR signals generated by the subject 405 in response to the RF excitation pulses. The RF coil driver unit 407 supplies current to the RF coil 403 to transmit the RF excitation pulse, and amplifies the MR signals received by the RF coil 403. The transmitting and receiving functions of the RF coil 403 or set of RF coils are controlled by the control unit 408 via the T/R switch 413. The T/R switch 413 is provided with electronic circuitry that switches the RF coil 403 between transmit and receive modes, and protects the RF coil 403 and other associated electronic circuitry against breakthrough or other overloads, etc. The characteristics of the transmitted RF excitation pulses, notably their strength and duration, are controlled by the control unit 408.

It is to be noted that though the transmitting and receiving coil are shown as one unit in this embodiment, it is also possible to have separate coils for transmission and reception, respectively. It is further possible to have multiple RF coils 403 for transmitting or receiving or both. The RF coils 403 may be integrated into the magnet in the form of a body coil, or may be separate surface coils. They may have different geometries, for example, a birdcage configuration or a simple loop configuration, etc. The control unit 408 is preferably in the form of a computer that includes a processor, for example a microprocessor. The control unit 408 controls, via the T/R switch 413, the application of RF pulse excitations and the reception of MR signals comprising echoes, free induction decays, etc. User input interface devices 411 like a keyboard, mouse, touch-sensitive screen, trackball, etc., enable an operator to interact with the MR system.

The MR signal received with the RF coils 403 contains the actual information concerning the local spin densities in a region of interest of the subject 405 being imaged. The signals received by a receiver 414 are reconstructed by the reconstruction unit 409, and displayed on the display unit 410 as an MR image or an MR spectrum. It is alternatively possible to store the signal from the reconstruction unit 409 in a storage unit 415, while awaiting further processing. The reconstruction unit 409 is constructed advantageously as a digital image-processing unit that is programmed to derive the MR signals received from the RF coils 403.

An interventional catheter (not shown) comprising the transmission cable disclosed herein may be used to pace the heart of the subject 405 while the subject is positioned in the MR system. Due to the use of an STL for transmission of the amplitude-modulated DC signal (203 of FIG. 2b), RF-induced heating at the tip of the interventional catheter can be kept to a minimum. The use of the rectifier unit to extract the DC signal (203 of FIG. 2b) from the amplitude-modulated DC signal (201 of FIG. 2a) enables the supply of DC signals over the STL. The extracted DC signal can be supplied to a cardiac pacing unit to pace the subject's heart. Alternatively, the extracted DC signal may be supplied to a device that requires DC power for operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. An electrically conductive transmission cable configured for safely treating a patient with a pulsed DC signal, in the presence of radiofrequency fields in a magnetic resonance environment the transmission cable being configured to
receive an RF modulated DC signal, the transmission cable comprising:
a transmission line comprising at least a first segment and a second segment, wherein the first and second segments are electrically connected to each other by a reactive coupling unit;
a rectifier unit connected to the transmission line and configured to extract the pulsed DC signal from the RF modulated DC signal; and
electrodes connected with the rectifier configured to apply the extracted pulsed DC signal to the patient.

2. The electrically conductive transmission cable of claim 1, wherein the reactive coupling unit includes a transformer.

3. The electrically conductive transmission cable of claim 1, wherein the reactive coupling unit includes an electrical impedance.

4. The electrically conductive transmission cable of claim 1, wherein the segments and/or the reactive coupling unit includes at least one metallic structure on a substrate.

5. An auxiliary device or an interventional catheter, including the electrically conductive transmission cable of claim 1, wherein the auxiliary device or interventional catheter is compatible for use in a magnetic resonance system.

6. The auxiliary device or interventional catheter, of claim 5, further including: a tracking circuit connected to the transmission cable, wherein the tracking circuit is configured to generate a tracking signal that may be tracked by the magnetic resonance system in order to determine the position of the auxiliary device or interventional catheter.

7. The auxiliary device or interventional catheter, of claim 5, wherein the tracking circuit is configured to transmit radio-frequency signals to and/or receive magnetic resonance signals from a subject under examination in the magnetic resonance system.

8. A cardiac pacing device electrically connected to the electrically conductive transmission cable of claim 1, wherein the cardiac pacing device is configured to apply the extracted pulsed DC signal to a heart of the patient.

9. The electrically conductive transmission cable of claim 1, further including: a rechargeable electrical storage device connected with the rectifier unit that is recharged by the extracted pulsed DC signal.

10. The electrically conductive transmission cable of claim 1, wherein the modulated pulsed DC signal is an amplitude-modulated DC signal.

11. The electrically conductive transmission cable of claim 1, including: a modulator configured to modulate an input pulsed DC signal on a radio-frequency carrier in order to generate the modulated pulsed DC signal.

12. The electrically conductive transmission cable of claim 1, including: at least one matching network with at least one inductor and/or capacitor and/or resistor, configured for matching at least one of the segments to the reactive coupling unit.

13. The electrically conductive transmission cable of claim 1, wherein the rectifier unit includes at least one diode connected in series to the transmission line and a low-pass filter connected in series to the diode.

14. A magnetic resonance system configured for safely treating a patient using a pulsed DC signal in an MR environment, the system comprising:
a modulator which modulates a pulsed DC signal with a radio frequency carrier in order to generate an RF modulated DC signal;
an electrically conductive transmission cable configured for safely transmitting the RF modulated DC signal, the transmission cable including:
a transmission line comprising at least a first segment and a second segment, wherein the first and second segments are electrically connected to each other by a reactive coupling unit;
a rectifier unit connected to the transmission line and configured to extract the pulsed DC signal from the RF modulated DC signal; and
electrodes connected to the rectifier in order to apply the extracted pulsed DC signal to anatomical tissue of a patient.

15. A method for safely treating a patient using a pulsed DC signal in the presence of radiofrequency fields in an MR environment, the method comprising:
generating a pulsed DC signal;
modulating the pulsed DC signal with an AC signal in order to generate a modulated DC signal;
transmitting the modulated DC signal on a transmission line which includes a plurality of reactively coupled segments;
rectifying the modulated DC signal which has been transmitted on the transmission line in order to recover the pulsed DC signal;
applying the recovered pulsed DC signal to a patient; and
concurrently performing a magnetic resonance procedure while the generating, modulating, transmitting, rectifying, and applying steps of the method are carried out.

16. The method of claim 15, wherein the pulsed DC signal is a cardiac pacing signal and applying the recovered pulsed DC signal includes: applying the recovered pulsed DC signal to a patient's heart.

17. The method of claim 15, wherein applying the recovered pulsed DC signal includes applying the recovered pulsed DC signal to tissue to be ablated.

18. The method of claim 15, wherein applying the recovered pulsed DC signal includes powering at least one of a pressure sensor, a partial gas pressure sensor, a flow sensor, and a temperature sensor with the recovered pulsed DC signal.

* * * * *